(12) United States Patent
Breece, III et al.

(10) Patent No.: US 9,263,992 B1
(45) Date of Patent: Feb. 16, 2016

(54) CLASS D AMPLIFIER WITH VARIABLE SWITCHING FREQUENCY

(71) Applicant: Apple Inc., Cupertino, CA (US)

(72) Inventors: David C. Breece, III, Sunnyvale, CA (US); Dirk Schmelzer, Sunnyvale, CA (US); Nathan A. Johanningsmeier, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/486,768

(22) Filed: Sep. 15, 2014

(51) Int. Cl.
*H03F 3/217* (2006.01)
*H03F 1/02* (2006.01)
*H03F 3/183* (2006.01)
*H03F 3/21* (2006.01)

(52) U.S. Cl.
CPC .............. *H03F 1/0205* (2013.01); *H03F 3/183* (2013.01); *H03F 3/211* (2013.01); *H03F 3/217* (2013.01); *H03F 2200/03* (2013.01); *H03F 2200/171* (2013.01); *H03F 2203/21106* (2013.01)

(58) Field of Classification Search
USPC .............................................. 330/251, 207 A
IPC ................................................ H03F 3/217,1/04
See application file for complete search history.

(56) References Cited

U.S. PATENT DOCUMENTS

| | | | | |
|---|---|---|---|---|
| 5,247,581 | A * | 9/1993 | Gurcan | G05F 3/225 330/10 |
| 6,587,670 | B1 * | 7/2003 | Hoyt | H03F 1/0261 455/63.1 |
| 6,753,729 | B2 | 6/2004 | Broadley | |
| 7,113,030 | B2 | 9/2006 | Yang et al. | |
| 2002/0033734 | A1 * | 3/2002 | Broadley | H03F 1/32 330/251 |
| 2011/0043283 | A1 | 2/2011 | Huang et al. | |
| 2011/0227645 | A1 * | 9/2011 | Mayuzumi | H03F 3/217 330/251 |
| 2013/0088294 | A1 * | 4/2013 | Heineman | H03F 1/26 330/207 A |
| 2013/0223651 | A1 | 8/2013 | Hoyerby | |
| 2014/0354352 | A1 * | 12/2014 | Noro | H03F 3/217 330/10 |

FOREIGN PATENT DOCUMENTS

WO WO-2013164229 A1 11/2013

OTHER PUBLICATIONS

MAX9709, maxim integrated™, 25W/50W, Filterless, Spread-Spectrum, Stereo/Mono, Class D Amplifier, 19-3769; Rev. 2, May 2014, 20 pages.
"Class D Amplifier Design Basics II", International Rectifier, Feb. 19, 2009, Rev. 1.0, 74 pages.

(Continued)

*Primary Examiner* — Patricia T Nguyen
(74) *Attorney, Agent, or Firm* — Blakely, Sokoloff, Taylor & Zafman LLP (57) ABSTRACT

A method for operating an audio system having multiple Class D audio amplifiers is described. An external oscillatory signal is coupled to the amplifiers, such that the switching frequencies of both of the amplifiers align with (e.g., are directly set to) a frequency of the external signal. An input level associated with an audio signal that is being amplified is detected, and the detected input level is compared to a threshold. When the comparison indicates that the input level is below a lower threshold, the frequency of the external oscillatory signal is raised, and when the comparison indicates that the input level is above an upper threshold, the frequency of the external oscillatory signal is lowered. Other embodiments are also described and claimed.

20 Claims, 5 Drawing Sheets

(56) References Cited

OTHER PUBLICATIONS

Berkhout, Marco, et al., "Audio at Low and High Power", 2008 IEEE, Solid-State Circuits Conference, 2008. ESSCIRC 2008. 34th European, DOI: 0.1109/ESSCIRC.2008.4681788, pp. 40-49.

Honda, Jun, et al., "Application Note AN-1146", International Rectifier, IRS2093M Functional Description, Mar. 26, 2009, pp. 1-37.

Honda, Jun, et al., "Application Note AN-1159", International Rectifier, IRS2052M Functional Description, Apr. 10, 2014, 44 pages.

Pillonnet, Gael, et al., "A High Performance Switching Audio Amplifier Using Sliding Mode Control", Circuits and Systems and TAISA Conference 2008, NEWCAS-TAISA 2008, 2008 Joint 6th International IEEE Northeast Workshop Jun. 22-25, 2008, ISBN: 978-1-4244-2332-3, pp. 305-309.

Quek, Yang B., "Class-D LC Filter Design", Texas Instruments, Application Report, SLOA119A, Apr. 2006—Revised Jan. 2008, pp. 1-20.

\* cited by examiner

CLASS D AMPLIFIER WITH VARIABLE SWITCHING FREQUENCY

An embodiment of the invention is directed to audio systems that use Class D power amplifiers for amplifying an audio signal, and in particular, self-oscillating Class D amplifiers that are synchronized or locked with an external oscillator. Other embodiments are also described.

BACKGROUND

Audio systems are increasingly relying upon Class D switching output amplifiers for their audio power amplification needs. Relative to linear amplifiers, Class D audio amplifiers are much more efficient while not giving up too much in terms of linear performance (e.g., showing low distortion and high dynamic range). There are several types of Class D amplifiers, in relation to the manner in which their switching power stages are controlled. In one type, a periodic ramp signal having a pulse width modulation (PWM) carrier frequency (that is typically much higher than the audio range) is generated and compared to the input audio signal. The output of the comparison is a variable pulse width square wave signal whose pulse width becomes longer when the input audio amplitude is larger, shorter when the input audio amplitude is smaller. This output signal (which may be considered to have a fixed switching frequency) is then applied to a switching type power stage, and the output of the power stage is low-pass filtered to remove the PWM carrier, yielding an amplified audio signal. Another type of Class D amplifier is a self-oscillating type in which the variable pulse width square wave signal is produced by a self-oscillating circuit receiving the input audio signal. The switching frequency in that case is not fixed, but rather varies depending on the audio input level. An external oscillator may be added that injects charge into the amplifier, so as to synchronize or lock the switching frequency to a desirable value. The external oscillator may also be made variable, e.g. as a spread spectrum type that shifts the switching frequency around randomly to improve immunity against electromagnetic interference.

SUMMARY

An embodiment of the invention is an audio system having multiple Class D amplifiers, e.g. a pair configured in a bridge tied load (BTL) configuration. Each Class D amplifier may be a self-oscillating type such that at idle or muting, the switching frequency of one of the amplifiers will be different than that of another, due to for example manufacturing tolerances (even if both amplifiers are replicas of the same amplifier design). This difference induces a "beat frequency" component that may be heard through one or more speakers that are being driven by the amplifiers, as undesirable or unintended audible interference. To avoid this, an external oscillator is provided that injects charge into each self-oscillating Class D amplifier so as to synchronize or lock the switching frequencies of all of the amplifiers, to the frequency of the external oscillator.

It has been found that at idle, the switching frequency of a self-oscillating amplifier is "high" but then steadily decreases, as the level of the input audio signal or amplifier output power increases. This has been found to actually be desirable, because it improves the energy efficiency of the amplifier. In other words, efficiency is increased on two fronts, namely when the self-oscillating Class D amplifier a) at idle is operating at a higher switching frequency, and b) at high power is operating at a lower switching frequency. But it has also been found that the external oscillator solution (for synchronizing the multiple self-oscillating Class D amplifiers, in order to avoid beat frequency audible interference) reduces energy efficiency of the audio system. That may be because the external oscillator prevents the switching frequency from rising significantly during idle.

An embodiment of the invention is directed to a method for improving the efficiency of such an audio system, by processing the input audio signal or a volume setting for the audio signal, to detect an input level, and on that basis varying the frequency of the external oscillator, as follows. When the input level is detected to be below a threshold, e.g. the input audio is idle or muted, the frequency of the external oscillator is raised. But when the detected input level is above the threshold, the frequency of the external oscillator is lowered. This may enable the audio amplifiers to exhibit greater energy efficiency than typical self-oscillating Class D amplifiers that are not synchronized to the external oscillator because an "optimal" switching frequency that was found to yield higher efficiency, at a given amplifier output power level, can be forced by the external oscillator.

In accordance with another embodiment of the invention, a switching frequency of a Class D audio amplifier, which may be one that relies on natural PWM generation rather than a self-oscillating type, is set by controlling a variable oscillator so that when the detected input level is below a lower threshold the switching frequency is raised, and when it is above an upper threshold the switching frequency is lowered. The lower and/or upper thresholds and their associated low and high switching frequency values may be determined previously, e.g. during laboratory testing, so that the amplifier exhibits increased efficiency while operating at or near those thresholds. In one embodiment, a set of two or more discrete output power levels for the amplifier are selected and a corresponding set of two or more switching frequencies are determined (e.g., during laboratory testing) that enable the amplifier to operate at those output power levels with improved efficiency. This data, or a curve that best fits such data, is then stored in production specimens of the amplifier as part of a controller that automatically adjusts the frequency of the variable oscillator during in-the-field use of each production specimen, so that the amplifiers' switching frequency is changed thereby enabling the amplifiers to operate as efficiently as possible at various output power levels.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
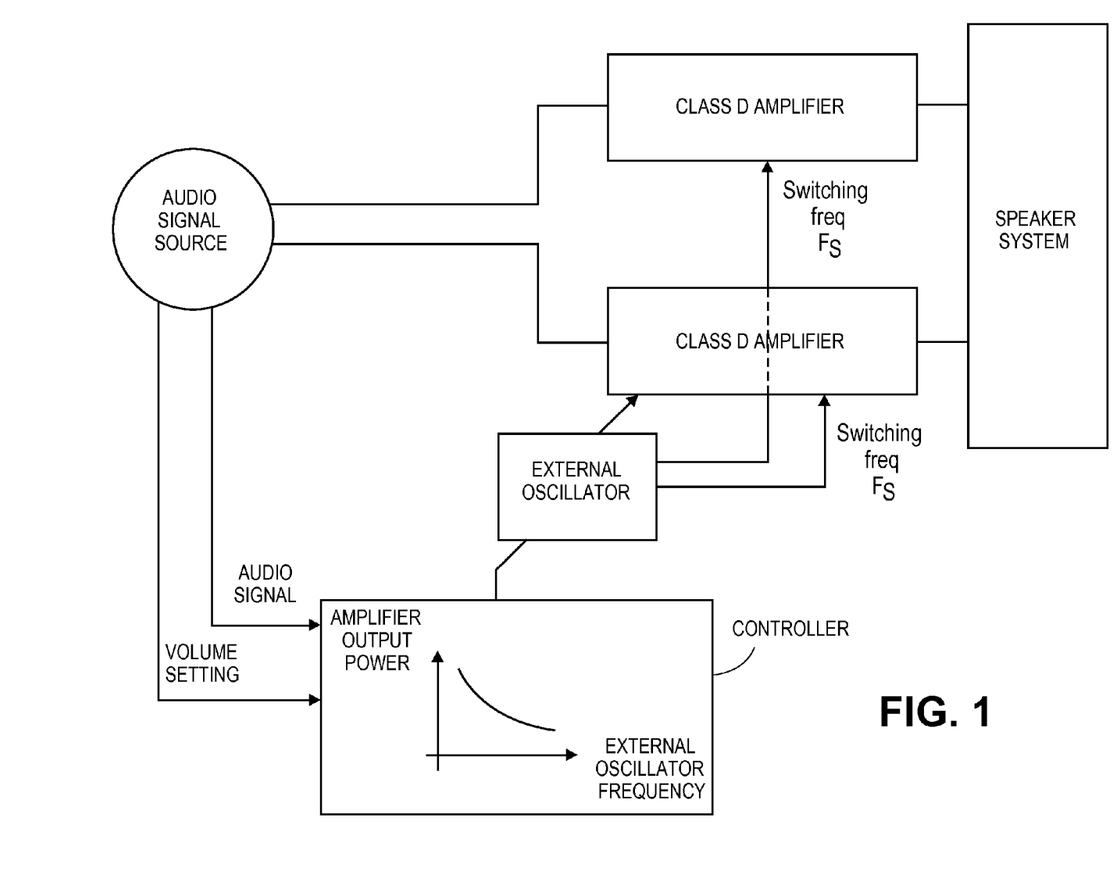
FIG. 1 is a block diagram of an audio system, in accordance with an embodiment of the invention.
Figure 6:
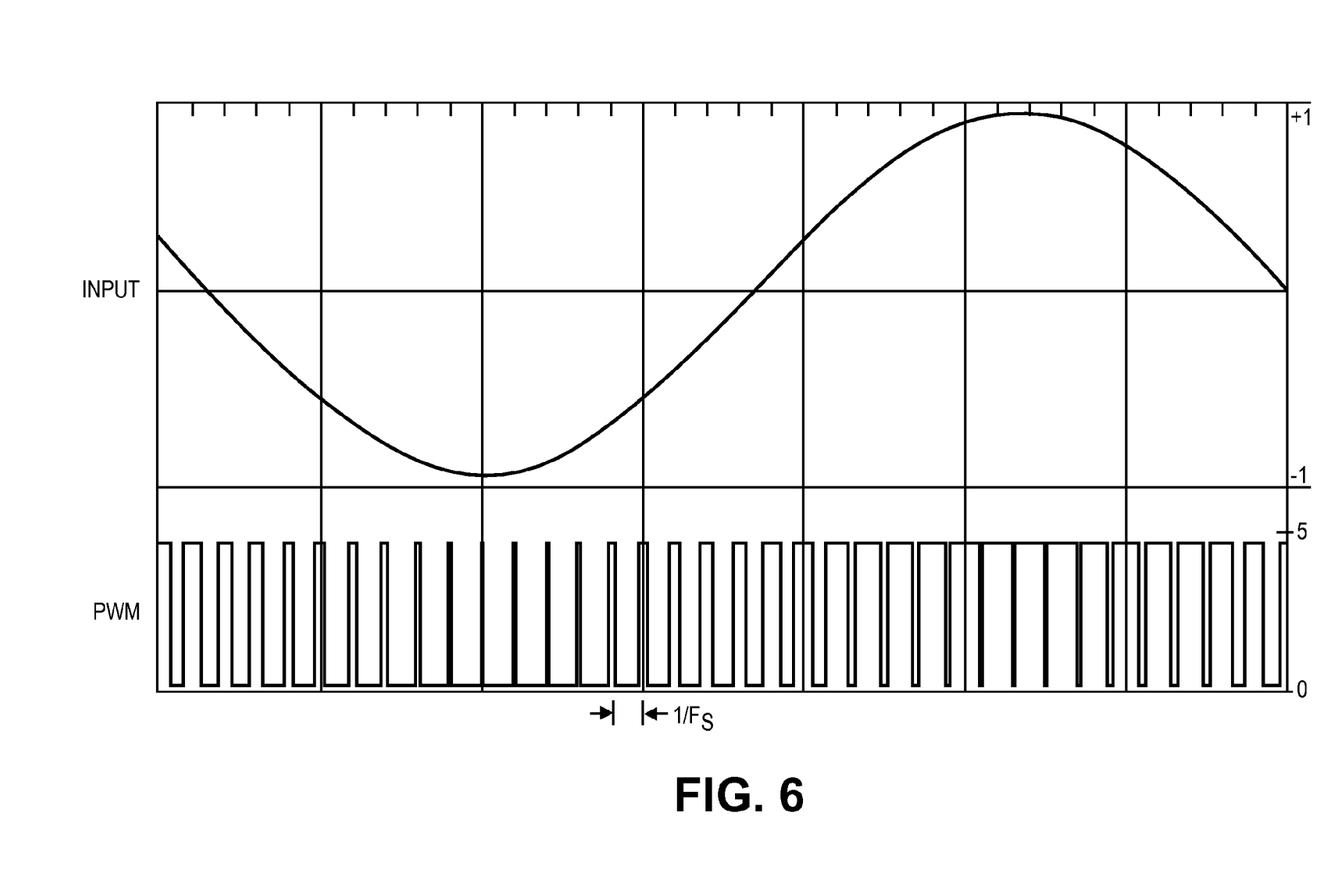
FIG. 6 is an example pulse with modulated waveform and its corresponding input audio signal, used to illustrate the concept of switching frequency in a Class D amplifier.

FIG. 1 is a block diagram of an audio system, in accordance with an embodiment of the invention. The audio system is composed of a number of Class D amplifiers each of which may be of the self-oscillating type or of the type that has a natural pulse width modulation (PWM) generator. Although only two are shown, it should be understood that the concepts here are applicable to audio systems having more than two such Class D amplifiers for driving a speaker subsystem. As described below using particular examples, see for example FIG. 2, generally speaking a Class D amplifier has a Class D modulator section that produces at its output a variable duty cycle square wave of which the low-frequency portion of its spectrum is essentially the desired audio signal, while the high-frequency portion serves essentially no other purpose than to make the modulator output waveform binary, so that the audio signal can be amplified by switching the power devices of a power stage. The relevant concept here is that of "switching frequency" which may be viewed as a high-frequency component of the spectrum of the variable duty cycle square wave, that serves to render the binary waveform aspect of the square wave. The switching frequency may be chosen to be at least ten or more times the highest frequency of interest in the audio signal. As an example, FIG. 6 shows such a variable duty cycle square wave having a switching frequency $F_s$, and the corresponding desired audio signal, where the latter effectively modulates the pulse widths of the high-frequency ($F_s$) square wave as shown.

In the case of a self-oscillating Class D amplifier, its Class D modulator stage produces the variable duty cycle square wave directly from an oscillator circuit (not shown) that can oscillate within a predetermined frequency range for $F_s$ and can track, is synchronized with, locks to, or aligns with the variable frequency $F_s$ of an external oscillator. For example, the oscillator circuit may be designed using an operational amplifier (Op Amp) or an operational transconductance amplifier (OTA), and whose self-oscillating frequency can be set using an appropriate selection of passive devices to define a feedback network for the Op Amp or the OTA. The oscillator circuit in that case may be designed with an injection input that enables it to become injection-locked with the external oscillator. By contrast, in the case of a Class D amplifier that has a separate PWM generator, e.g. a natural PWM generator, the Class D modulator stage may generate a periodic ramp signal that is compared to the input audio signal to produce the pulse width modulated square wave. In that case, the external oscillator may directly set the fundamental frequency of the periodic ramp signal. Other designs for a Class D modulator are possible.

The Class D amplifier at its output may also include a passive low-pass filter that removes the unwanted high-frequency components, including that of the switching frequency, and smoothes certain high-frequency edges and recovers the desired low-frequency signal which is the audio signal but in amplified form. The power stage used to obtain the amplification typically uses solid state power switches (e.g., based on field effect transistors) as shown, to switch the output current between high side and low side power supply rails.

Figure 2:
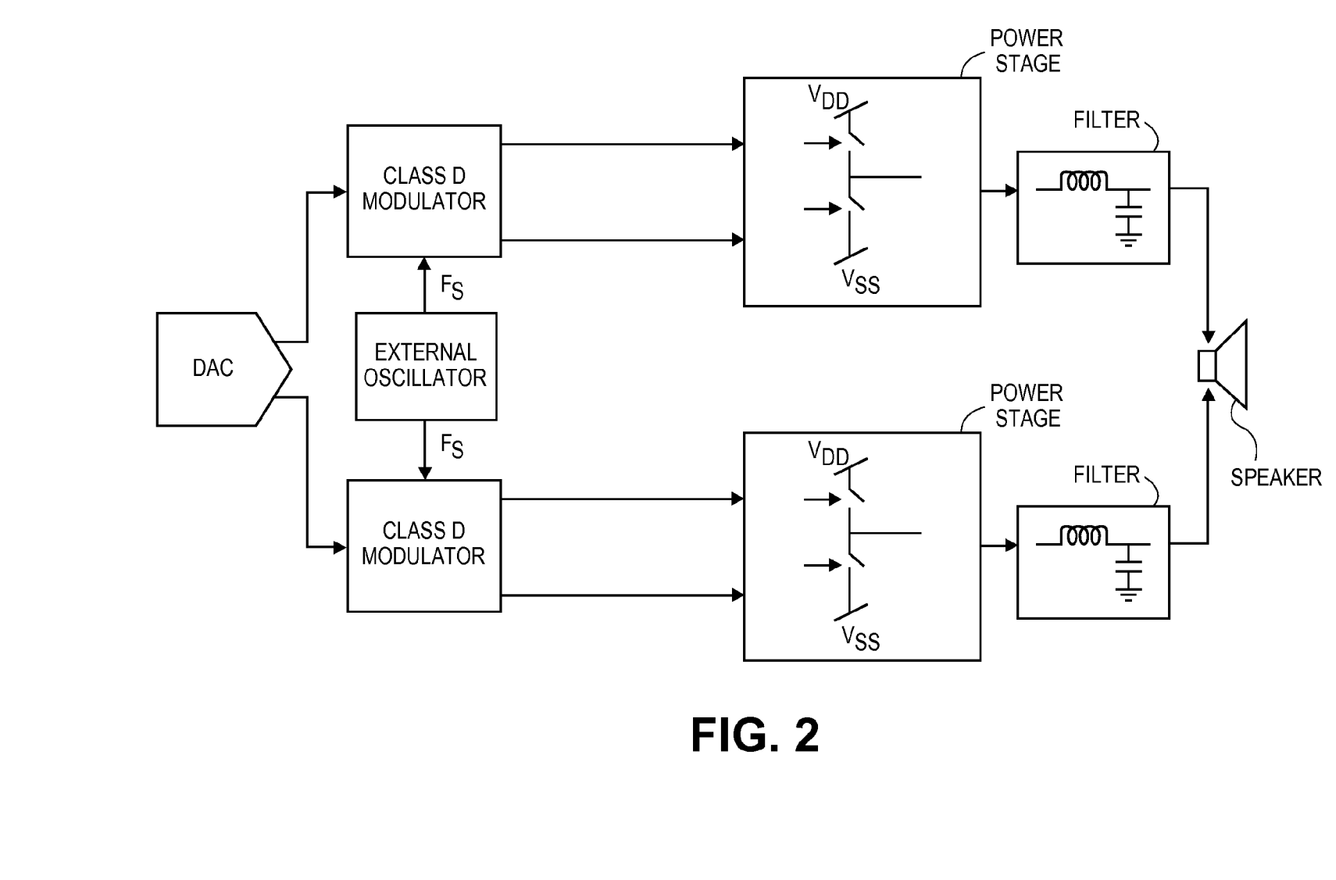
FIG. 2 is a block diagram of an example Class D amplifier design.

Still referring to FIG. 1 and FIG. 2, the input signal to the Class D amplifiers may be from any suitable audio signal source, including, for example, a programmed processor that is running a digital media player application program.

In one embodiment of the invention, the audio signal source provides its output audio signal not only to the Class D amplifiers but also to a controller that is responsible for setting the output frequency of the external oscillator, as shown. The audio signal may reflect a volume setting (e.g., in accordance with a user's manually set volume level). This volume setting may be provided to the controller instead of (or in addition to) the audio signal, because it is assumed that the strength of the input audio signal reflects the volume setting. The controller may be an analog circuit, a programmed processor, or a hybrid of analog and digital circuitry that serves as a means for signaling the control input of the external oscillator so that a) the frequency of the external oscillator, when volume of the audio system is at a lower setting, is higher than b) the frequency of the external oscillator when the volume is at a higher setting. In another embodiment of the signaling means, when the controller processes the input audio signal (either digitally or via analog signal conditioning) to detect the input level, and then compares the detected input level to a threshold, the frequency of the external oscillator is raised when the comparison indicates that the detected audio input level is below a lower threshold. In addition, when the detected input level is above an upper threshold, the frequency of the external oscillator is lowered. As introduced above in the Summary section, this combination of varying the external oscillator's output frequency, which serves to synchronize or align (e.g., directly set, in the case of a natural PWM generator) the switching frequencies of multiple Class D amplifiers, also helps improve efficiency of the overall audio system. Simulation results that show such an improved efficiency are presented below in connection with a particular example of a self-oscillating Class D amplifier design (although it should be noted the beneficial result of improved efficiency may also be achieved with other types of Class D amplifier designs).

Turning now to FIG. 2, a block diagram of a particular instance of a Class D amplifier design is shown, which will be used to illustrate some advantages of the variable switching frequency approach mentioned above. In this case, the audio system has two Class D audio amplifiers, where each has a signal input that is coupled to an audio signal source through, in this case, a digital-to-analog converter (DAC). Each amplifier has a Class D modulator section, which may be of the self-oscillating type, that receives the input audio signal in analog form, and generates the pulse width modulated binary waveform that is then used for controlling the power stage.

The power stage features any suitable arrangement of digitally controllable solid state switches that route power between upper and lower power supply rails and an output node, e.g. a field effect transistor (FET) half bridge that is driven with a set of bipolar junction transistor (BJT) buffers. Note that the BJT buffers may not be needed in all instances. Also, the half bridge FET may be replaced with any other suitable solid state power switching circuitry. The output node of the power stage is coupled to a low-pass filter, in this example an L-C filter that serves to remove the switching frequency component and otherwise smooth the desired audio portion (which has been amplified), before driving a terminal of a speaker as shown.

In this case, each of the Class D amplifiers drives a different terminal of the same speaker, also referred to as complementary terminals of the same speaker, in what is commonly referred to as a bridge tied load (BTL) configuration. Using the approach depicted in FIG. 2, for an audio signal source having, for example, just two audio channels (e.g., left and right), nominally requiring for example two speakers, a set of four Class D amplifiers will be needed. Thus another set of amplifiers as shown in FIG. 2 will be needed to drive the second speaker (not shown). In this connection, it should be noted that in the BTL configuration, the input audio signal to each Class D amplifier may be a polarity reversed version of the other, where in this case the two complementary input signals may be generated by a differential output digital-to-analog converter (DAC) that is converting a single monaural audio signal at its input. Although not shown, an alternative to the BTL configuration is to have a single Class D amplifier driving each speaker separately.

Figure 3:
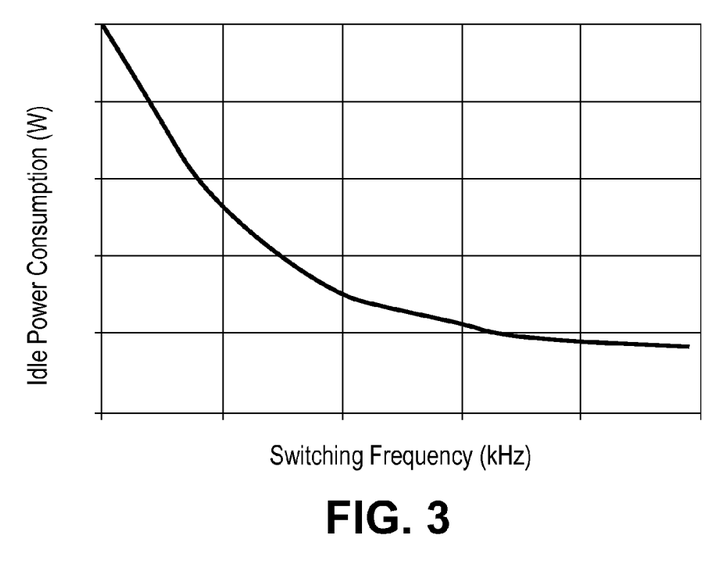
FIG. 3 is a simulation plot of idle power consumption vs. switching frequency of the Class D amplifier design of FIG. 2.
Figure 4:
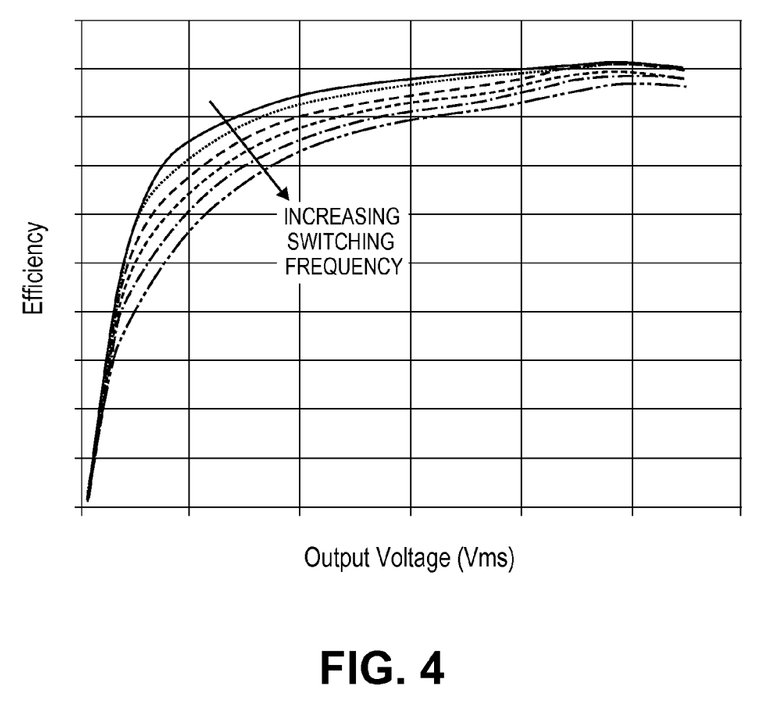
FIG. 4 is a plot of amplifier efficiency vs. output voltage for six different switching frequency settings.

A self-oscillating Class D amplifier design connected to an external oscillator as in FIG. 2 was characterized or simulated, resulting in a plot depicted in FIG. 3 of idle power consumption vs. switching frequency. It can be seen that increasing the switching frequency of the self-oscillating type Class D amplifier beneficially decreases its power consumption at idle (e.g., muting, when not playing any audio signal or when playing silence or at a very low volume setting). It was also noticed, however, that increasing the switching frequency led to an increase in power consumption or a reduction in efficiency, at higher output power levels—see FIG. 4. FIG. 4 is a plot of efficiency vs. output or load voltage of the Class D amplifier, where it can be seen that at relatively high power, for example at about the middle of the full scale range, there is a distinct reduction in efficiency as the switching frequency is increased, for example, by a factor of two, e.g. from about 250 kHz to about 500 kHz.

One possible explanation for the effects on power consumption that can be seen in FIG. 3 and FIG. 4 is that at idle or low output power levels, the losses in the inductors of the filter (see FIG. 2 which shows an LC filter having an inductor L in series between an output node of the power stage and a terminal of the speaker being driven) may dominate the overall power consumption of the amplifier. However, as the switching frequency decreases, the ripple current in the inductor of the filter increases, leading to higher power dissipation in the inductor. Thus, at idle and low output power levels, if the switching frequency is too low, then the peak-to-peak inductor current, that is the inductor ripple current, may be too large thereby causing power loss in the inductor to dominate the overall power consumption. When the switching frequency increases, the inductor ripple current becomes smaller (smaller peak-to-peak) which leads to lower power dissipation.

However, at high output power levels, it is the switching losses within the power switch transistors (e.g., FETs) of the power stage that may be expected to dominate the overall power consumption of the amplifier (in contrast to the losses in the filter inductor). Therefore, in that case, a higher switching frequency will lead to more transitions of the power switch transistors and therefore higher power consumption.

In accordance with the embodiments of the invention described above, efficiency of the amplifier may be improved by varying the switching frequency as follows. At idle and low power output levels, a higher switching frequency is used. When the output voltage magnitude or output power reaches a certain value, however, the switching frequency is decreased to a lower value, in order to realize lower power consumption at the higher power output levels. As mentioned above, this may be achieved by processing the input audio signal or a volume setting to detect an input level, and then comparing the detected input level to a threshold. When the comparison indicates that the detected input level is below a lower threshold, the frequency of the external oscillatory signal (which is coupled to the Class D self-oscillating amplifiers) is increased. When the comparison indicates that the detected input level is above an upper threshold, the frequency of the external oscillatory signal is lowered.

Note that in one embodiment, the upper and lower thresholds may be essentially the same (preferably with some hysteresis) such that there are only two distinct frequencies at which the amplifier can operate. In another embodiment, there may be more than two distinct frequencies such that more thresholds are needed to resolve the operating condition of the amplifier. In yet another embodiment, the external oscillator can be controlled to exhibit a continuous range of frequencies (rather than discrete frequencies) that may be "mapped" to a continuous range of audio input level or to a set of discrete manual user volume settings.

Figure 5:
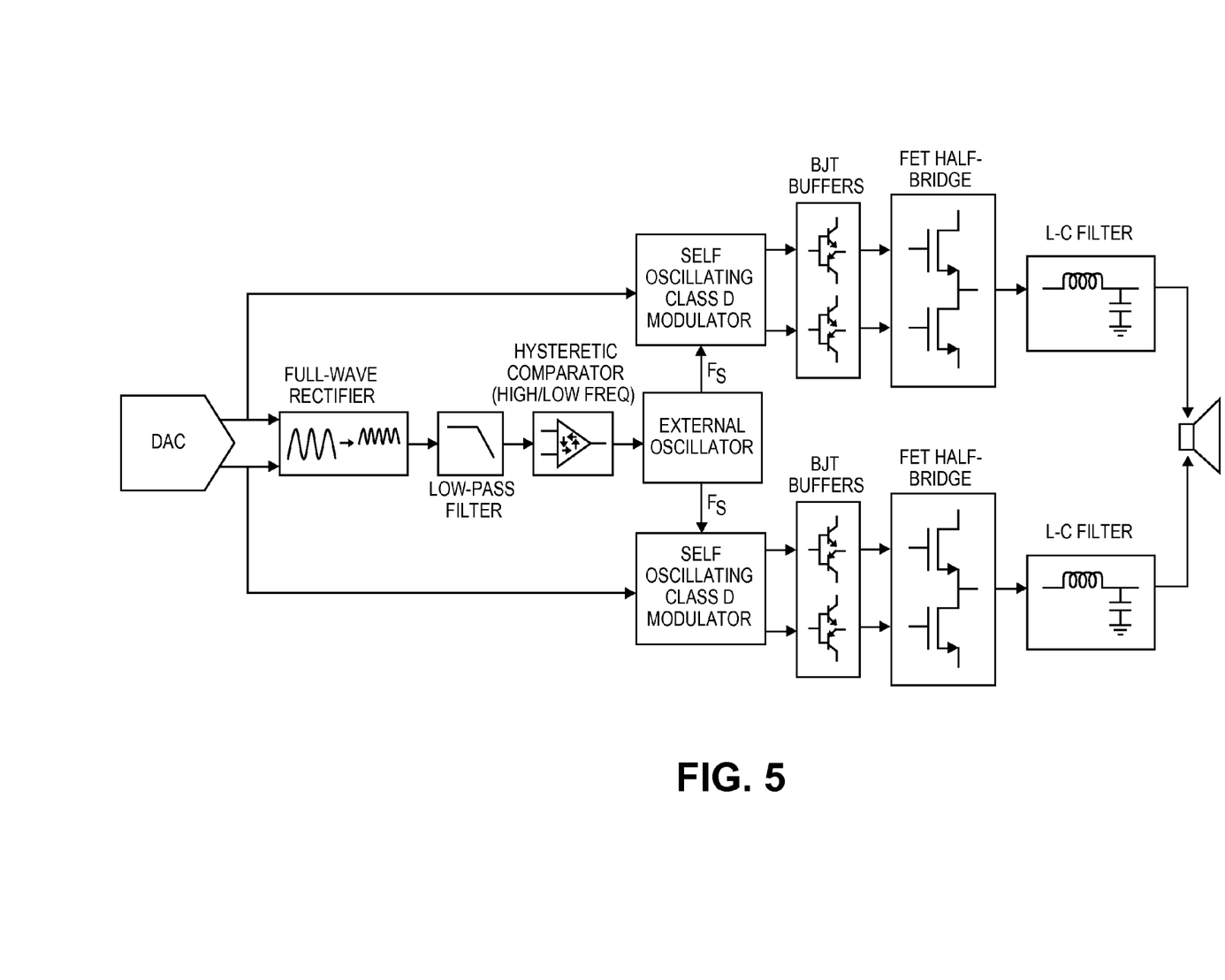
FIG. 5 is a block diagram of another embodiment of an audio system having variable switching frequency Class D amplifiers.

In one embodiment, the audio signal starts as a digital audio signal, such that the digital audio signal is converted into analog form before being fed to an input of the Class D amplifier. In one embodiment, referring now to FIG. 5, the audio signal processed by the controller (see FIG. 1) may be an analog audio signal, e.g. from a digital-to-analog converter (DAC), such that processing of the audio signal involves analog signal conditioning by, for example, performing half-wave or full-wave rectification followed by low pass filtering as shown, in order to detect the input level. The detected input level is then compared to a threshold. In the case of FIG. 5, the comparison may involve upper and lower thresholds that are part of a hysteresis range, such that the comparison of the detected input level to the threshold in a sense includes the addition of hysteresis, e.g. using a hysteretic comparator to transition between selection of a low switching frequency and a high switching frequency.

In one embodiment, the frequency of the external oscillatory signal can be raised by selecting one of two or more discrete frequencies that is higher than another one of the discrete frequencies. Alternatively, the frequency of the external oscillator can be continuously variable, rather than in discrete steps. Both are achieved in accordance with a control signal received at its control input that may be generated by the controller (see FIG. 1). In a further embodiment, the external oscillator is a variable frequency oscillator whose output frequency is only variable in accordance with the control input. Alternatively, the external oscillator may be a spread spectrum oscillator whose output frequency varies not only in accordance with the control input but also in a pseudo-random or random manner, in order to assist in immunity against electromagnetic interference.

Still referring to FIG. 5, an analog signal conditioning approach is shown for the processing of the audio signal in order to detect an input level and make the comparison of the detected input level to a threshold (using a hysteretic comparator in that case). An alternative to the analog approach here is to process a digital version of the audio signal, by digitally computing a measure of power, energy, or otherwise strength of the digital audio signal over a given time interval, in order to detect the input level. In that case, the input level detector and the comparator may be implemented as a programmed processor that performs digital signal processing upon the digital audio signal (taking the signal in front of the DAC shown in FIG. 5 rather than at the output of the DAC), in order to compute the detected input level and compare the detected input level to the threshold. The input level detector and comparator in that case (which would be part of the controller depicted in FIG. 1) may have an input coupled to a digital form of the audio signal from the audio signal source, such that subsequent processing to compute the input level and comparison to the threshold can also be computed in digital domain. Alternatively, the input level detector and comparator may be implemented in analog form as shown in FIG. 5 (again as part of the controller of FIG. 1) where in that case the input level detector may have an input that is coupled to an analog audio signal being an analog signal that has been converted by the DAC. This may include both the "normal" signal and its reversed polarity version. The comparator will then perform an analog comparison operation, a result of which is applied to the control input of the external oscillator.

In yet another embodiment, a means for signaling the control input of the external oscillator may have a digital input level detector having an input coupled to a digital audio signal from which a monaural audio signal and its reversed polarity version in analog form have been derived (e.g., by the DAC as seen in FIG. 5), where the monaural analog audio signal and its reversed polarity version are fed to the signal inputs of the Class D amplifiers while the input level detector operates upon the digital version of the audio signal. The comparator may also be implemented digitally in that case, performing digital signal processing upon the detected input level and then signaling the control input of the external oscillator to raise or lower the frequency of the oscillator.

In addition, as suggested above, the means for signaling the control input of the external oscillator may be such that a) the frequency of the external oscillator, when volume of the audio system is at a lower setting, is higher than b) the frequency of the external oscillator when the volume is at a higher setting. This may be the case where the volume setting is available from the audio signal source (FIG. 1) thereby avoiding the need to process either an analog or digital form the audio signal itself.

The external oscillator may have as few as two discrete frequencies, high and low, or it may have more than two, or it could have a continuously variable or controllable oscillation frequency. In such cases, the means for signaling the control input makes a selection amongst discrete frequencies, or the oscillation frequency is continuously varied, based on a sensed or computed measure of strength of the input audio signal, or alternatively, or in addition, based on a received volume setting. As the strength of the input audio signal goes up, or as the volume setting goes up, the frequency of the external oscillator drops; and as the strength of the input audio signal goes down or the volume goes lower, the frequency of the external oscillator raises.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method for operating an audio system having a plurality of Class D audio amplifiers, the method comprising:
    generating an external oscillatory signal, wherein switching frequencies of the plurality of Class D amplifiers are synchronized to a frequency of the external oscillatory signal;
    detecting an input level associated with an audio signal;
    comparing the detected input level to a threshold;
    when the comparison indicates that the detected input level is below a lower threshold, raising the frequency of the external oscillatory signal; and
    when the comparison indicates that the detected input level is above an upper threshold, lowering the frequency of the external oscillatory signal.

2. The method of claim 1 wherein the audio signal is a digital audio signal, the method further comprising converting the digital audio signal into analog form before feeding an input of the plurality of amplifiers.

3. The method of claim 1 wherein the audio signal is an analog audio signal, and wherein detecting an input level comprises processing the audio signal by performing half-wave or full-wave rectification and low pass filtering upon the analog audio signal, to detect the input level.

4. The method of claim 2 wherein detecting the input level comprises processing the audio signal by digitally computing a measure of power, energy, or strength of the digital audio signal over a time interval, to detect the input level.

5. The method of claim 1 wherein the upper and lower thresholds are part of a hysteresis range, and wherein comparing the detected input level to the threshold comprises adding hysteresis.

6. The method of claim 1 wherein raising the frequency of the external oscillatory signal comprises selecting one of two or more discrete frequencies that is higher than another one of the discrete frequencies.

7. An audio system comprising:
    a plurality of Class D audio amplifiers each of which has an input coupled to an audio signal source;
    an external oscillator coupled to the plurality of amplifiers so that switching frequencies of the plurality of amplifiers align with a frequency of the external oscillator, wherein the frequency is variable in accordance with a control input of the external oscillator;
    an input level detector having an input coupled to the audio signal source; and
    a comparator having an input to receive a detected input level and another input to receive a threshold, while the audio signal source is coupled to the input of the plurality of amplifiers, the comparator having an output that is coupled to the control input of the external oscillator so that when the detected input level is below a lower threshold, the frequency of the external oscillator is raised and when the detected input level is above an upper threshold the frequency is lowered.

8. The audio system of claim 7 further comprising a digital-to-analog conversion circuit coupled to the audio signal source, to provide audio signals in analog form at the inputs of the amplifiers.

9. The audio system of claim 7 wherein at least a pair of the plurality of Class D audio amplifiers are in a bridge tied load configuration to drive input terminals of the same speaker.

10. The audio system of claim 9 further comprising a digital-to-analog conversion circuit coupled to the audio signal source, to provide a monaural audio signal and its polarity reversed version in analog form at the inputs of the pair of Class D amplifiers.

11. The audio system of claim 7 wherein each of the plurality of Class D audio amplifiers is configured to drive a separate speaker.

12. The audio system of claim 7 wherein the input level detector comprises a half-wave or full-wave rectifier feeding a low pass filter.

13. The audio system of claim 7 wherein the external oscillator is a variable frequency oscillator whose output frequency is only variable in accordance with the control input.

14. The audio system of claim 7 wherein the switching frequency of each of the plurality of Class D amplifiers is a high frequency portion of the spectrum of a variable duty cycle square wave that serves to render a binary waveform of the square wave, wherein a low-frequency portion of the spectrum is a desired audio signal coming from the audio signal source.

15. An audio system comprising:
   a first Class D audio amplifier being a self-oscillating type and having an input to receive an analog monaural audio signal;
   a second Class D audio amplifier being a self-oscillating type and having an input to receive a reversed polarity version of the monaural audio signal;
   an external oscillator coupled to the first and second Class D amplifiers so that switching frequencies of the amplifiers synchronize with a frequency of an output signal of the external oscillator, wherein the frequency is variable in accordance with a control input of the external oscillator;
   means for signaling the control input of the external oscillator so that a) the frequency of the external oscillator when volume of the audio system is at a lower setting, is higher than b) the frequency of the external oscillator when the volume is at a higher setting.

16. The audio system of claim 15 wherein the means for signaling the control input of the external oscillator comprises:
   an input level detector having an input coupled to an audio signal from which the monaural audio signal and its reversed polarity version have been derived; and
   a comparator having an input to receive a detected input level and another input to receive a threshold, the comparator having an output that is coupled to the control input of the external oscillator.

17. The audio system of claim 15 wherein the external oscillator is a spread spectrum oscillator whose output frequency varies a) in a pseudo-random or random manner and b) in accordance with the control input.

18. The audio system of claim 15 wherein the frequency of the external oscillator is continuously variable, rather than in discrete steps, in accordance with a signal received at the control input.

19. The audio system of claim 16 further comprising a digital-to-analog converter that produces the analog monaural audio signal and its reversed polarity version from the audio signal being a digital audio signal.

20. The audio system of claim 19 wherein the input level detector and the comparator are implemented as a programmed processor that performs digital signal processing upon the digital audio signal to compute the detected input level and compares it to the threshold.

* * * * *